United States Patent [19]

Segal et al.

[11] 4,200,668
[45] Apr. 29, 1980

[54] METHOD OF REPAIRING A DEFECTIVE PHOTOMASK

[75] Inventors: Paul D. Segal, Plainsboro Township, Mercer County; Ching-Ping Wong, West Windsor Township, Mercer County, both of N.J.

[73] Assignee: Western Electric Company, Inc., New York, N.Y.

[21] Appl. No.: 939,607

[22] Filed: Sep. 5, 1978

[51] Int. Cl.² ............................................. B05D 3/06
[52] U.S. Cl. ..................................... 427/53.1; 427/10; 427/140; 427/142
[58] Field of Search ....................... 427/8, 10, 53, 140, 427/142, 43, 54

[56] References Cited

U.S. PATENT DOCUMENTS

| | | |
|---|---|---|
| 2,447,836 | 8/1948 | Beeber et al. |
| 3,650,796 | 3/1972 | Jackson et al. ........................ 427/53 |
| 3,748,975 | 7/1973 | Tarabocchia ........................ 96/27 E |
| 4,107,351 | 8/1978 | James et al. ............................. 427/43 |

OTHER PUBLICATIONS

Smith et al., "IBM Tech. Disc. Bull.", v. 11, No. 9, p. 1151, Feb. 1969.
Hawkins et al., "IBM Tech. Disc. Bull.", v. 12, No. 6, p. 735, Nov. 1969.
Fugardi, "IBM Tech. Disc. Bull.", v. 14, No. 10, p. 2855, Mar. 1972.
Thompson et al., "J. Electrochem. Soc. Solid State Sci. and Tech.", vol. 120, No. 12, pp. 1722-1726.

*Primary Examiner*—John H. Newsome
*Attorney, Agent, or Firm*—J. F. Spivak

[57] ABSTRACT

A method of repairing pin holes in a defective photomask such as one comprising a patterned chromium film on a glass substrate comprises depositing an adhesion promoting film such as siloxane on the surface of the photomask, then depositing a solvent soluble layer such as a photoresist layer over the adhesion promoting layer, a window is then formed through the layers and underlying photomask in the area of the pin hole by burning through these layers by means of a laser. The exposed areas of the window are etched and a metallic film is deposited over the exposed surfaces. Finally, the photomask is treated with solvent for removing the solvent soluble photoresist which also causes the metal film deposited thereon to be removed in all areas except the area of the window.

30 Claims, 8 Drawing Figures

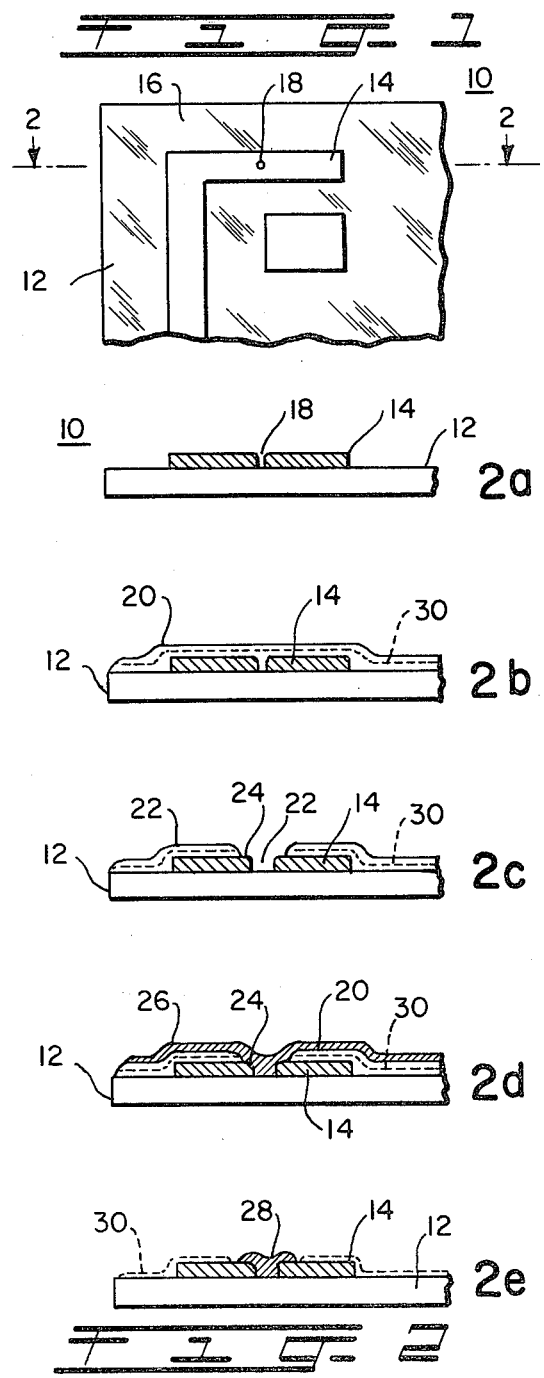

METHOD OF REPAIRING A DEFECTIVE PHOTOMASK

TECHNICAL FIELD

This invention relates to a method of repairing defective photomasks. More particularly, the present invention relates to a method for repairing a pin hole defect in a metal photomask.

BACKGROUND OF THE INVENTION

Photomasks are particularly useful in the manufacture of circuit patterns, such as, for use in the manufacture of integrated circuits in the electronic arts. Typically, a photomask comprises a patterned metal film such as chromium, nickel or aluminum in a thickness in the order of 1,000 A. deposited on a transparent base, such as glass or quartz. It is generally manufactured by depositing a thin film of the metal on the surface of the transparent substrate, coating the film of metal with a photoresist coating, exposing a patterned region on the photoresist coating, developing the photoresist coating, and removing the metal from the unprotected areas of the film by etching, leaving a patterned metal film on the substrate.

In the manufacture of metal photomasks, defects such as pin holes or missing portions of metal film may occur. These defects in turn cause defective integrated circuits or other devices produced from these masks. Since the manufacture of photomasks is generally a time consuming and relatively expensive operation, it is often desirable to correct a defective photomask rather than to discard it. One method for repairing a defective photomask has been described in U.S. Pat. No. 3,748,975. This method is similar to the method of manufacturing the original photomask in that it involves depositing a photoresist coating over the surface of the photomask and exposing the photoresist coating to light in the region overlying the defect to be corrected, developing the photoresist coating and then, depending upon the kind of photoresist coating used, the defect can be etched away where the defect is one consisting of a protrusion of excess metal or can be rendered opaque where the defect consists of holes or missing areas. When this method is employed for repairing pin hole defects or the like, one must use essentially all of the same steps employed in making the initial photomask. In the procedure of the present invention, fewer steps are required and materials other than photoresists can be employed when economically desirable.

SUMMARY OF THE INVENTION

A method of repairing a defect in a photomask which comprises a patterned metal film on a transparent substrate comprises: (1) coating the surface of the defective photomask with a solvent soluble film; (2) creating a window in the film and photomask by removing a small portion of said solvent soluble film and underlying metal film in the area of and around the defect; (3) forming a second coating over said first coating and window with a non-solvent soluble opaque material; and (4) treating the mask with a solvent for dissolving the solvent soluble film thereby causing both the solvent soluble film and non-solvent soluble material thereon to be stripped from the mask leaving only the non-solvent soluble opaque material remaining in the regions where the window was created.

BRIEF DESCRIPTION OF THE DRAWING

FIG. 1 is a top cross-sectional elevational view of a typical photomask having a pin hole defect therein;

FIGS. 2(a)-2(e) are side cross-sectional elevational views of the photomask of FIGS. 1 through 2—2 showing the defect repair process steps;

DETAILED DESCRIPTION

Figure 3:
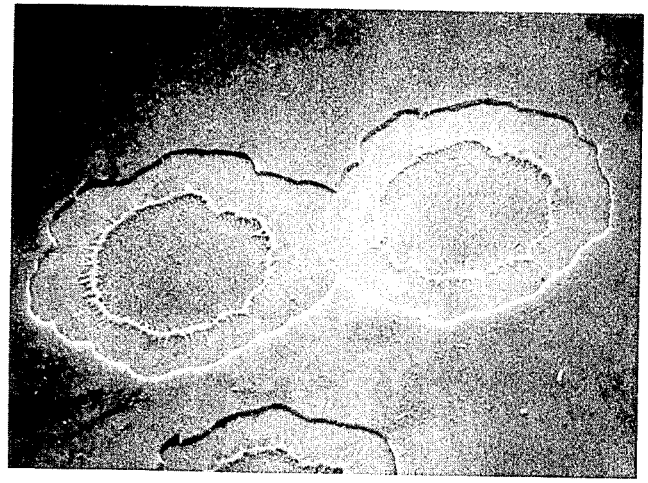
FIG. 3 is an electron photomicrograph of a window formed through the solvent soluble film and underlying mask material by means of a laser.

The present invention will be discussed primarily in terms of repairing pin hole defects in a photomask. It will be readily appreciated that the novel method of this invention can be used for correcting voids or defects on films on a substrate other than damaged photomasks.

In the manufacture of integrated circuits using photoresists which are developed in accordance with predetermined patterns, photomasks are used for determining the pattern to be developed in the photoresist. Generally, several photomasks are used for the processing of an integrated circuit. If the photomask that is employed contains pin holes, missing areas or other voids in regions which were to have been opaque, the resulting pattern developed onto the photoresist during the manufacturing process of the integrated circuit will reflect these unwanted defects in the photomask and will result in unsuitable integrated circuits which must be discarded. Consequently it is important to have photomasks which are essentially free of defects. Often, however, such defects do arise in the manufacture of the photomask and rather than having to discard the entire photomask it is often more economical to repair the defects if possible.

Referring to FIG. 1, there is shown a photomask 10 comprising a transparent substrate 12 such as a sheet of glass, quartz or sapphire, for example, having a patterned film 14, such as a layer of chromium, nickel or aluminum formed on one surface 16 of the photomask 10. Typically, the metallic film is from 500 A. to 1,000 A. thick. The pattern may be formed by photolithographic means well known in the integrated circuit electronic art. The photomask 10 may have one or more defects, particularly, pin hole type defects, in the patterned film 14 as represented in exaggerated form by pin hole defect 18, as shown. Typically, these defects are from 5 to 10 micrometers in diameter. However, defects as small as 2 to 3 micrometers as well as larger defects are not unusual.

In accordance with the present invention, the pin hole defects 18 are repaired by coating the surface of the photomask with a solvent soluble film 20, locating the defect 18 or defects to be repaired, forming a window or opening 22 through the solvent soluble film 20 and underlying film 14 of the photomask in the region of the defect 18, said opening 22 generally being larger than the size of the original defect 18, coating the solvent soluble film 20 and opening 22 with an opaque material 26 which is not soluble in the solvent which dissolves the solvent soluble film 20 and which is adherent to the exposed surfaces of the photomask, and then stripping the solvent soluble film 20 with solvent thereby causing the opaque film 26 to be removed in the areas in which it overlies the solvent soluble film 20 but remain in the areas in which it overlies the window or opening 22 thereby covering the region which was originally the pin hole defect 18.

Suitable solvent soluble films include photoresists which are commercially available and well known in the electronics art, solvent soluble polymers such as polyvinyl alcohol or polymethylmethacrylate, solvent soluble resins and soluble grease. The solvent soluble film is generally applied in a thickness in the order of 10,000 A. or 10 times the thickness of the metal film of the photomask to at least the top surface 16 of the photomask or alternatively may be applied to the entire photomask. Coating of the solvent soluble film may be accomplished by well known coating techniques such as dip coating or spray coating or, depending upon the consistency of the film forming material, may be brushed or rubbed on or otherwise applied to the surface of the photomask so as to uniformly coat the photomask.

It is desirable to employ a solvent soluble film which has reasonably good adhesion to the surface of the glass so that it will not peel or break away during processing and will form a good uniform coating over the photomask. It has been discovered that the adhesion of many film materials can be enhanced by first coating the photomask with a thin transparent film 30 of a transparent material which is not readily soluble in the solvent used to strip the solvent soluble film but which contains moieties which adhere well to the surface of the glass while providing other moieties which adhere well to the solvent soluble film. Suitable adhesion promoting films for many photoresists and other polymers are films of silanes and siloxanes. A preferred adhesion promoting film is hexamethyl-disiloxane. This film may be formed on the photomask, by example, by spin coating from a 0.2 percent solution in ethanol, air drying and heating to 150° C. for 15 minutes for a thin layer of siloxane.

Typically the opening or window 22 that is formed in the photomask in accordance with the novel procedure is several times larger than the diameter of the defect 18 to be repaired. It has been discovered that when the opening 22 is formed by use of a laser a surprising and unexpected result is achieved which facilitates the repair of the pin hole 18. More particularly, the hole 22 produced in the solvent soluble film 20, and adhesive layer 30, when present, by means of burning through the coatings with a laser, is wider than the hole produced in the underlying metallic patterned film 14. This provides a lip 24 over which the opaque repairing film 26 lies so as to completely overlap the exposed surface of the substrate 12. The general shape of the opening 22 formed with the laser is that approximating concentric circles (FIG. 3), the bottom circle being the hole in the metallic patterned film 14 and the larger other circle formed over the overlay or lip region 24 of the metallic film representing the hole in the solvent soluble film 20. It should be understood that while forming the opening 22 with a laser is preferred, especially for the reason that in one step one may obtain an opening which has an overlay or lip region 24 for facilitating better contact and repair of the photomask, other methods for forming openings may also be employed.

In the preferred procedure, in order to assure adhesion of the opaque repairing film to the photomask, one should etch both the surface of the lip of the metallic pattern and the exposed portion of the transparent base material. This can be accomplished, for example, by dipping the photomask, after formation of the opening, into a solution comprising ceric ammonium nitrate so as to etch the metallic patterned surface of the exposed lip followed by dipping the photomask into a solution comprising hydrofluoric acid, fluoboric acid or a mixture thereof, to etch the transparent base.

The opaque film 26 used in repairing the photomasks is preferably a metallic film which can be formed over the surface in any one of many ways. For example, the film may be formed by vacuum evaporation, sputtering, vapor deposition or electroless plating techniques. It has been found preferable to form the film utilizing electroless plating techniques. Generally, photomask repair is accomplished by forming films of nickel or chromium by standard electroless plating methods. These methods are well known in the art and generally comprise the steps of first sensitizing and activating the surface to be plated followed by immersion or treatment with an electroless plating solution so as to form a metallic film over the surface. Typical electroless solutions useful for repairing photomasks are electroless nickel and electroless chromium solutions. Such solutions are commercially available.

The pin hole defects to be repaired in the photomask are generally located using a scanning optical comparator device employing collimated light which compares the photomask to be repaired with a photomask free of defects such that when a defect is reached during the scan a signal indicates the presence of a defect. Other techniques such as microscopic examination are, of course, also available for determining the location of the defects. The laser used for forming the opening can be directly associated with the defect locating means. For example, the laser can be part of the scanning optical comparator used to detect the defect or can be coupled to the microscope used for detecting the defects so as to emit its beam through the microscope lens directly onto the defect.

It should be understood that in the case of photomasks, where endurance and abrasion resistance is desired, it is preferable to use metallic films for repair. However, films of other opaque materials can be used.

EXAMPLE I

Figure 4:
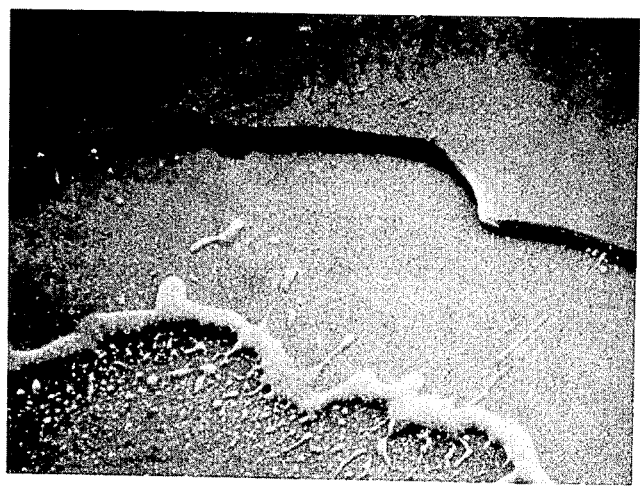
FIG. 4 is an enlargement of a portion of FIG. 1 showing the tiered effect produced by the laser.

About a 10 micron thick coating of Shipley AZ 1350Z photoresist is spin coated on a photomask to be repaired. The coating is dried at 25° C. and the coated photomask is placed in a laser equipped comparator for detecting the pin holes. When a pin hole is detected, holes are burned through the photoresist coating and underlying metal coating of the photomask in the region of the defect using an yttrium aluminum garnet laser having approximately a 5 watt laser output. FIGS. 3 and 4, which are photomicrographs of the opening formed by the laser, clearly show the tiered effect obtained when forming the holes with the laser. The center portion of the hole represents the transparent base, the first ring or lip region represents the metallic patterned film of the photomask while the top layer represents the photoresist film. As can be seen from the photomicrographs the holes formed in the metallic film are approximately 25 to 30 micrometers in diameter while the hole formed in the photoresist is approximately 20 micrometers larger in diameter thereby forming an approximate 10 micrometer lip onto which the hole repairing plating material can be formed. The photomask is then etched by dipping in chromic acid followed by dipping in the solution of hydrofluoric or fluoboric acid at room temperature. The photomask is then rinsed and treated with a tin chloride electroless metal sensitizing solution followed by treatment with a palladium chloride catalyzing solution so as to sensitize and catalyze the surface for electroless nickel plating. The catalyzed surface of the photomask is then dipped in an electroless nickel plate solution such as MacDermic Incorporated J-67 or J-28R electroless nickel solutions which are operated at 70° C. After formation of the electroless nickel deposit over the surface of the photomask, the photomask is treated with methanol which is a solvent for the Shipley photoresist used. By this treatment, the photoresist is stripped from the photomask together with the nickel deposit thereover leaving only the metal deposited in the opening formed by the laser.

EXAMPLE II

A silane film in the order of about 1,000 A. is spin coated onto the mask to be repaired in order to promote adhesion of the subsequent coating. The silane coating is air dried and the mask is then heated to 150° C. for 15 minutes. A 10µ thick photoresist layer of AZ 1350Z Shipley photoresist is then spin coated onto the mask. The pin hole areas are then registered in the comparator and an yttrium aluminum garnet laser having a 5 watt output is used to burn through the photomask in the region of the pin holes. The photomask is then etched with a solution consisting of 91 grams ceric ammonium nitrate, 24 milliliters of acetic acid diluted to 500 milliliters with distilled water. Etching is preferably accomplished in an ultrasonic bath environment. The photomask is rinsed and then placed in a fluoboric acid etch solution to etch the underlying glass substrate of the photomask. After rinsing the photomask to remove any excess etch solution thereon the photomask is placed in a tin solution containing 1.5% stannic chloride and from 1.5 to 2% stannous chloride so as to sensitize the surface of the photomask for electroless plating. The sensitized surface is rinsed and placed in a 5% palladium chloride solution to form a catalytic palladium deposit over the surface of the photomask for electroless nickel deposition. The photomask is then rinsed and placed in a commercial electroless nickel solution. After forming an electroless nickel deposit over the surface of the photomask, the photomask is then dipped in a solvent so as to remove the photoresist and nickel coating thereon leaving nickel deposited in the area of the hole formed by the laser.

It should be understood that any of the sensitizing solutions known in the art are suitable whether they are one-step or two-step sensitizers or activators and whether or not they employ noble metals or not. Sensitizing procedures may be found, in part, in *Metallic Coating of Plastics*, William Goldie, Electrochemical Publications, 1968, or with reference to U.S. Pat. Nos. 3,011,920; 3,532,518; 3,772,056; 3,772,078; 3,907,621; 3,925,578; and 3,930,963.

What is claimed is:

1. A method of repairing a defect in a film on a substrate comprises:
   coating the surface of the defective film with a solvent soluble layer;
   locating the defect to be repaired;
   forming a window through said solvent soluble layer and said underlying defective film in the area around said defect;
   coating said defective film and window with a non-solvent soluble opaque film; and
   stripping said solvent soluble layer from said substrate with solvent so as to remove said solvent soluble layer and said non-solvent soluble film thereover from said substrate leaving said non-solvent soluble film on said substrate in the area of said window.

2. The method recited in claim 1 wherein said window is formed so as to create an exposed lip of said film to be repaired.

3. The method recited in claim 1 wherein said window is formed by burning a hole in said solvent soluble layer and underlying defective film by means of a laser.

4. The method recited in claim 1 wherein said solvent soluble layer is selected from the group consisting of solvent soluble polymers, resins and greases.

5. The method recited in claim 1 wherein said solvent soluble layer is a photoresist.

6. The method recited in claim 1 wherein said solvent soluble layer is in the order of ten times the thickness of said defective film.

7. The method recited in claim 2 including the step of etching said exposed lip of said film and said substrate surrounded thereby prior to coating with said non-solvent soluble film.

8. The method recited in claim 1 wherein said non-solvent soluble film and said defective film are metallic.

9. The method recited in claim 8 wherein said metal films are metals selected from the group consisting of nickel, chromium and aluminum.

10. The method recited in claim 9 wherein said metals are selected from the group consisting of nickel and chromium and including the steps of sensitizing and activating the surfaces to be coated and electrolessly plating said metal onto said surfaces.

11. The method recited in claim 1 including the step of forming an adhesion promoting film over said defective film prior to coating with said solvent soluble layer.

12. The method recited in claim 11 wherein said adhesion promoting film is selected from the group consisting of silanes and siloxanes and wherein said substrate is selected from the group consisting of glass and quartz.

13. A method of repairing voids in a patterned metal film on a substrate comprises:
    coating the surface of said substrate and metal film with a solvent soluble layer;
    locating the void to be repaired;
    forming a window through said solvent soluble layer and underlying patterned film in the area around said void;
    coating said solvent soluble layer and said window area with a metallic film; and
    stripping said solvent soluble layer from said substrate with solvent so as to remove said solvent soluble layer and said metallic film thereover from said substrate leaving said metallic film only over the area of said window.

14. The method recited in claim 13 wherein said window is formed so as to create an exposed lip of said patterned metal film.

15. The method recited in claim 13 wherein said window is formed by burning a hole in said solvent soluble layer and underlying metal film by means of a laser.

16. The method recited in claim 13 wherein said solvent soluble layer is selected from the group consisting of solvent soluble polymers, resins and grease.

17. The method recited in claim 13 wherein said solvent soluble layer is a resist material.

18. The method recited in claim 14 including the step of etching said exposed lip of said patterned metal film and said substrate surrounded thereby prior to coating said window area.

19. The method as recited in claim 13 including the step of applying an adhesion promoting film over said patterned metal film prior to coating with said solvent soluble layer.

20. The method recited in claim 19 wherein said adhesion promoting film is selected from the group consisting of silanes and siloxanes.

21. The method recited in claim 13 wherein said patterned metal film is chromium and wherein said metallic film coated over said window is nickel.

22. A method of repairing pin hole defects in a photomask comprising a patterned metal film on a transparent substrate comprises:
   coating the surface of the defective photomask with a solvent soluble layer;
   locating the defect to be repaired;
   forming a window through said solvent soluble layer and underlying patterned metal film in the area around said pin hole;
   coating the exposed surfaces with a repairing metal film; and
   treating said photomask with solvent for stripping said solvent soluble layer and overlying repairing film leaving said repairing film in the area of said window.

23. The method recited in claim 22 including the step of forming an adhesion promoting film over said patterned metal film prior to coating the solvent soluble layer.

24. The method recited in claim 23 wherein said adhesion promoting film is selected from the group consisting of silanes and siloxanes.

25. The method recited in claim 22 wherein said window is formed so as to create an exposed lip of said patterned metal film.

26. The method recited in claim 22 wherein said window is formed by burning a hole through both said solvent soluble layer and the underlying metal film by means of a laser.

27. The method recited in claim 22 wherein said solvent soluble layer is selected from the group consisting of solvent soluble polymers, resins and grease.

28. The method recited in claim 22 wherein said solvent soluble layer is a resist material.

29. The method recited in claim 25 including the step of etching said exposed lip of said patterned metal film and said substrate surrounded thereby prior to coating said window area.

30. The method recited in claim 22 wherein said repairing film is nickel.

* * * * *